(12) United States Patent
Leung

(10) Patent No.: US 10,602,824 B2
(45) Date of Patent: Mar. 31, 2020

(54) HAIR STYLING APPARATUS

(71) Applicant: CONAIR CORPORATION, Stamford, CT (US)

(72) Inventor: Anthony Kit Lun Leung, Hong Kong (CN)

(73) Assignee: Conair Corporation, Stamford, CT (US)

( * ) Notice: Subject to any disclaimer, the term of this patent is extended or adjusted under 35 U.S.C. 154(b) by 374 days.

(21) Appl. No.: 15/320,624

(22) PCT Filed: Jun. 22, 2015

(86) PCT No.: PCT/US2015/036952
§ 371 (c)(1),
(2) Date: Dec. 20, 2016

(87) PCT Pub. No.: WO2015/196194
PCT Pub. Date: Dec. 23, 2015

(65) Prior Publication Data
US 2017/0196333 A1    Jul. 13, 2017

Related U.S. Application Data

(60) Provisional application No. 62/015,044, filed on Jun. 20, 2014.

(51) Int. Cl.
*A45D 1/04* (2006.01)
*A45D 2/12* (2006.01)
*A45D 2/24* (2006.01)
*H01J 37/08* (2006.01)

(52) U.S. Cl.
CPC ............... *A45D 1/04* (2013.01); *A45D 2/12* (2013.01); *A45D 2/24* (2013.01); *H01J 37/08* (2013.01); *A45D 2001/045* (2013.01); *A45D 2200/202* (2013.01)

(58) Field of Classification Search
CPC . A45D 1/10; A45D 1/04; A45D 2/367; A45D 2200/202; A45D 2/12; A45D 2/24; A45D 2001/045; H01J 37/08
See application file for complete search history.

(56) References Cited

U.S. PATENT DOCUMENTS

| | | | |
|---|---|---|---|
| 2007/0085036 A1 | 4/2007 | Santhouse | |
| 2008/0053982 A1* | 3/2008 | Ceva | A45D 1/04 219/225 |
| 2010/0212683 A1* | 8/2010 | Mizuno | A45D 1/04 132/223 |
| 2013/0068245 A1* | 3/2013 | De Benedictis | A45D 2/02 132/237 |
| 2015/0196105 A1 | 7/2015 | Leung | |

OTHER PUBLICATIONS

International Preliminary Report and Written Opinion in corresponding PCT Application No. PCT/US2015/036952, 8 pages.

* cited by examiner

*Primary Examiner* — Rachel R Steitz
*Assistant Examiner* — Brianne E Kalach
(74) *Attorney, Agent, or Firm* — Lawrence Cruz, Esq.; Ryan, Mason & Lewis, LLP

(57) ABSTRACT

A hair styling apparatus includes a handle, a rotatable component operatively coupled to the handle and adapted for rotatable movement to engage a length of hair to impart a curling effect to the length of hair and an ion generator mounted to the handle and dimensioned and adapted to direct a concentration of ions to the length of hair.

13 Claims, 7 Drawing Sheets

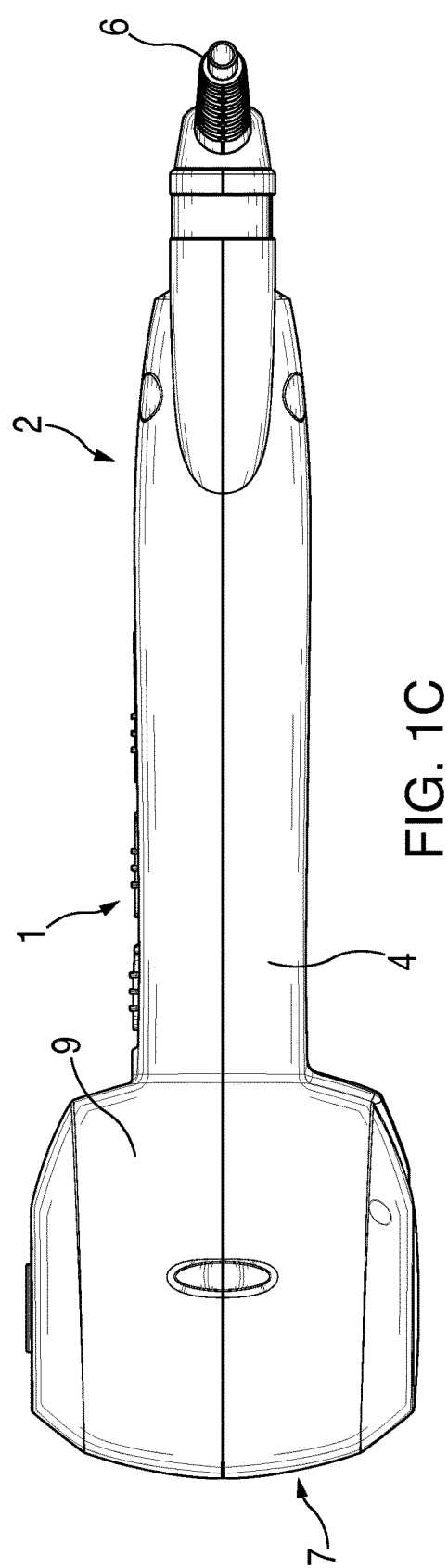
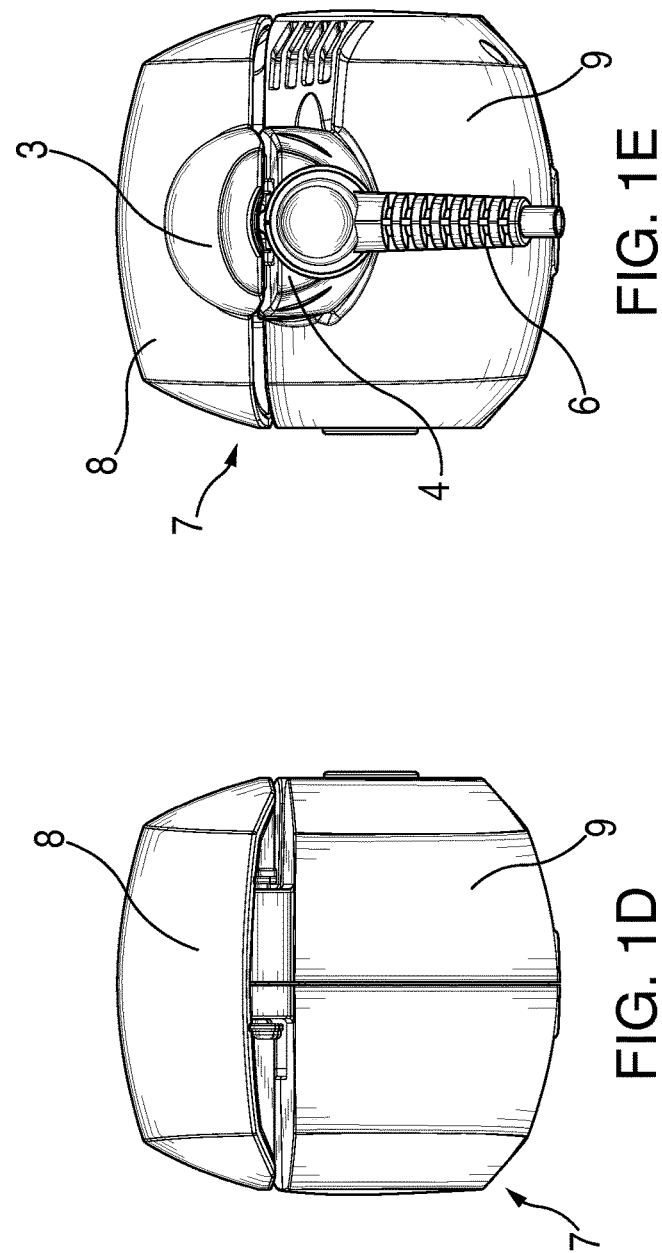

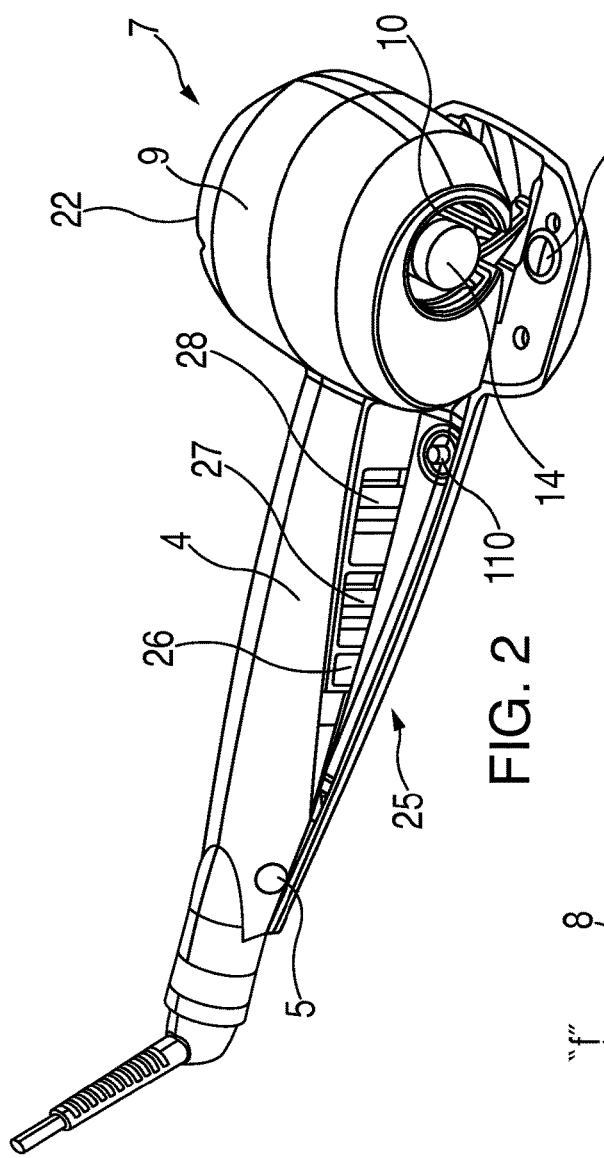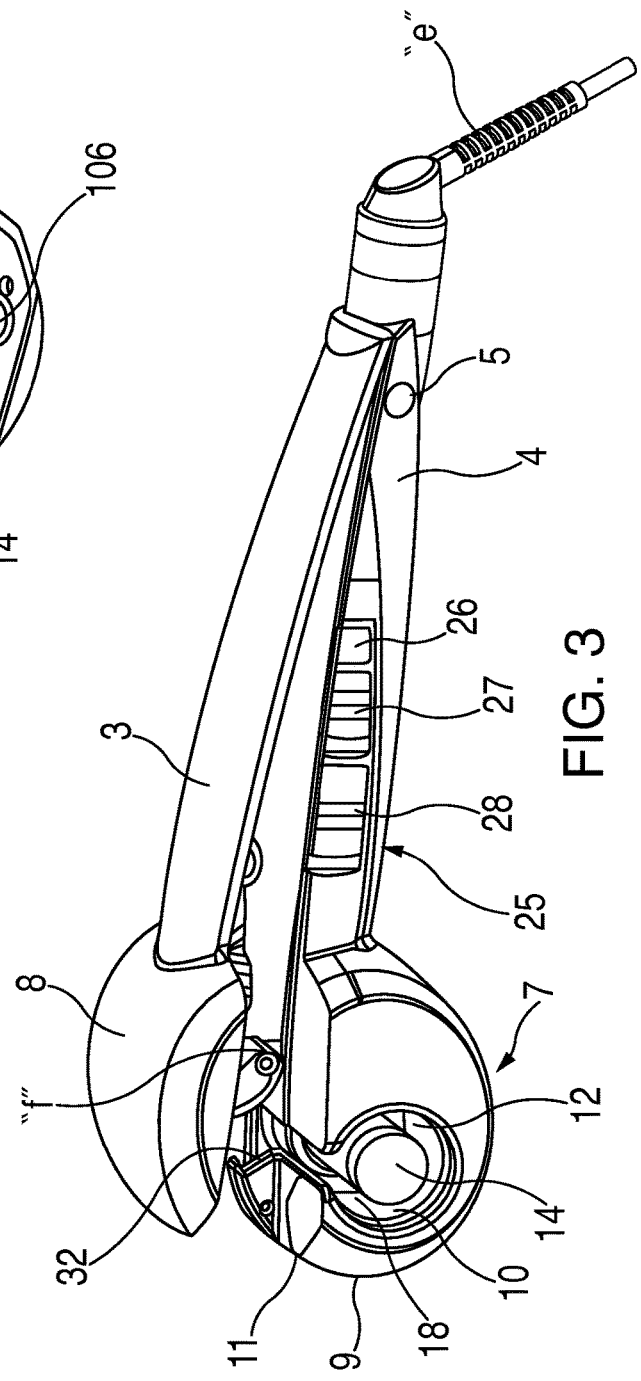

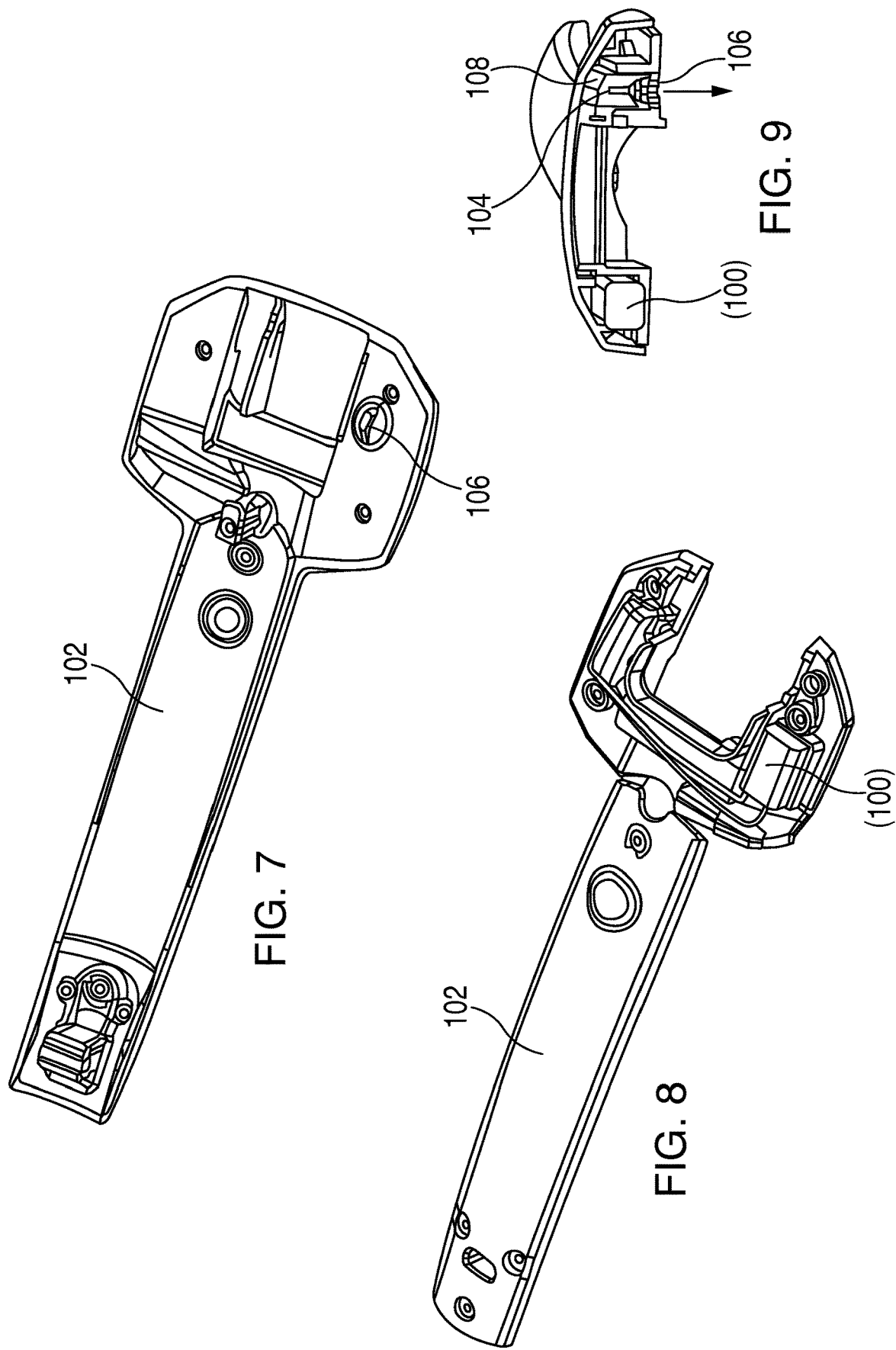

HAIR STYLING APPARATUS

CROSS REFERENCED TO RELATED APPLICATION

This application claims priority to, and the benefit of, U.S. Provisional Application Ser. No. 62/015,044, filed Jun. 20, 2014.

TECHNICAL FIELD

The present disclosure is directed to a hairstyling device, and, more particularly, to a hairstyling device for imparting curls within lengths of hair.

BACKGROUND

Hair styling devices for styling or curling hair are known in the art. For example, U.S. Pat. Nos. 8,607,804, 8,651,118, 8,733,374 and 8,869,808 and U.S. Design Pat. No. D696,456, each of these patents being incorporated herein by reference in its respective entirety, disclose a hair styling device which includes a rotatable component for wrapping hair about a guide member. The presently disclosed hair curling apparatus shares some features of select embodiments of the hair styling devices described in the patents identified above. In addition, the presently disclosed hair curling appliance provides an ion generator for directing charged ions to hair. The ionic discharge will impart a sleeker, smoother texture to the hair and reduces static electricity and frizz. The ionic generator in conjunction with the curler nay minimize the use of heat resulting in fewer split ends and heat-related damage while producing long sleek curls.

SUMMARY

Accordingly, the present disclosure is directed to a hair styling apparatus including a handle, a rotatable component operatively coupled to the handle and adapted for rotatable movement to engage a length of hair to impart a curling effect to the length of hair and an ion generator mounted to the handle, and dimensioned and adapted to direct a concentration of ions to the length of hair.

The hair styling apparatus may include an elongate member mounted relative to the handle and defining an axis. The rotatable component is configured and adapted for rotational movement about the axis of the elongate member to wrap or curl a segment of the hair about the elongate member. The rotatable component may include a hair engaging surface which is radially spaced from the elongate member. A retainer may be disposed adjacent the elongate member. The retainer may be dimensioned to retain a segment of the hair relative to the elongate member during rotation of the rotatable component to facilitate formation of curls within the length of hair.

The ion generator may include at least one ion emitter dimensioned to distribute the concentration of ions toward the length of hair. The handle may define at least one ion outlet through which the concentration of ions are directed from the at least one ion emitter toward the length of hair.

In one embodiment, the handle includes a first handle member having a first body defining an internal chamber dimensioned to receive a length of hair and a second handle member having a second body adapted for movement relative to the first handle between an open position and a closed position. The elongate member may be positioned within the internal chamber of the first body of the first handle. The rotatable component may be mounted to the first body and adapted for rotatable movement to engage the length of hair within the internal chamber and wrap a segment of the hair about the elongate member.

The ion generator may be mounted to the second body of the second handle member. The ion generator may include at least one ion emitter dimensioned to distribute the concentration of ions through at least one ion outlet of the second body toward the length of hair. The second handle member may include a frame mounted to the second body. The frame may have the ion generator and the ion emitter mounted thereto, and may define the at least one ion outlet. The frame may be releasably mounted to the second body of the second handle member.

The ion generator may be configured to provide a variety of voltage outputs. In one embodiment, the ion generator is adapted to create an ion concentration having a negative polarity. In other embodiments, the ion generator is adapted to create an ion concentration having a positive polarity. In a further embodiment, the ion generator is adapted to create an ion concentration both a positive and negative polarity.

A heater for heating the length of hair within the internal chamber may be provided.

The hair styling apparatus with the ion generator will impart a curling effect to a length of hair exhibiting a sleek smooth appearance while also conditioning the hair and minimizing hair related damage. Other aspects, features and advantages will be apparent from the description, drawings and the claims.

BRIEF DESCRIPTION OF THE DRAWINGS

Embodiments of the present disclosure will be readily appreciated by reference to the drawings wherein:

FIGS. 1A-1C are top, side and bottom plan views of the hair styling apparatus in accordance with the principles of the present disclosure;

FIGS. 1D-1E are front and rear axial views of the hair styling apparatus;

FIGS. 2-3 are perspective views of the hair styling apparatus;

FIG. 7 is a bottom perspective view of the frame of the upper handle supporting the ion generator;

FIG. 8 is a top perspective view of the frame of the upper handle supporting the ion generator; and FIG. 9 is a perspective view in partial cross-section illustrating the components of the ion generator.

DETAILED DESCRIPTION

Figure 1A:
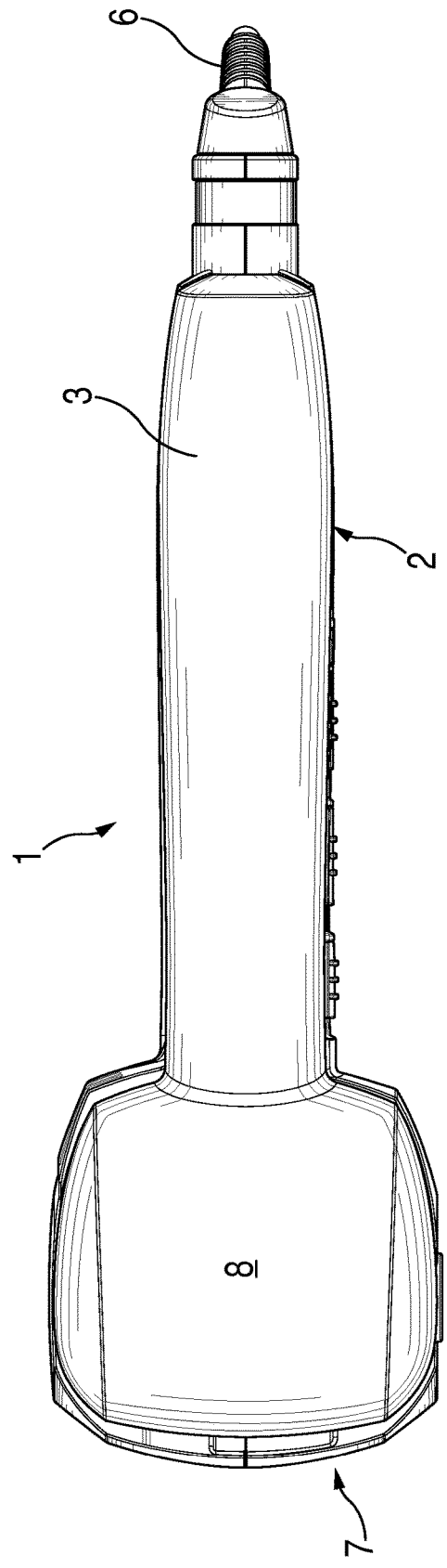
Figure 1B:
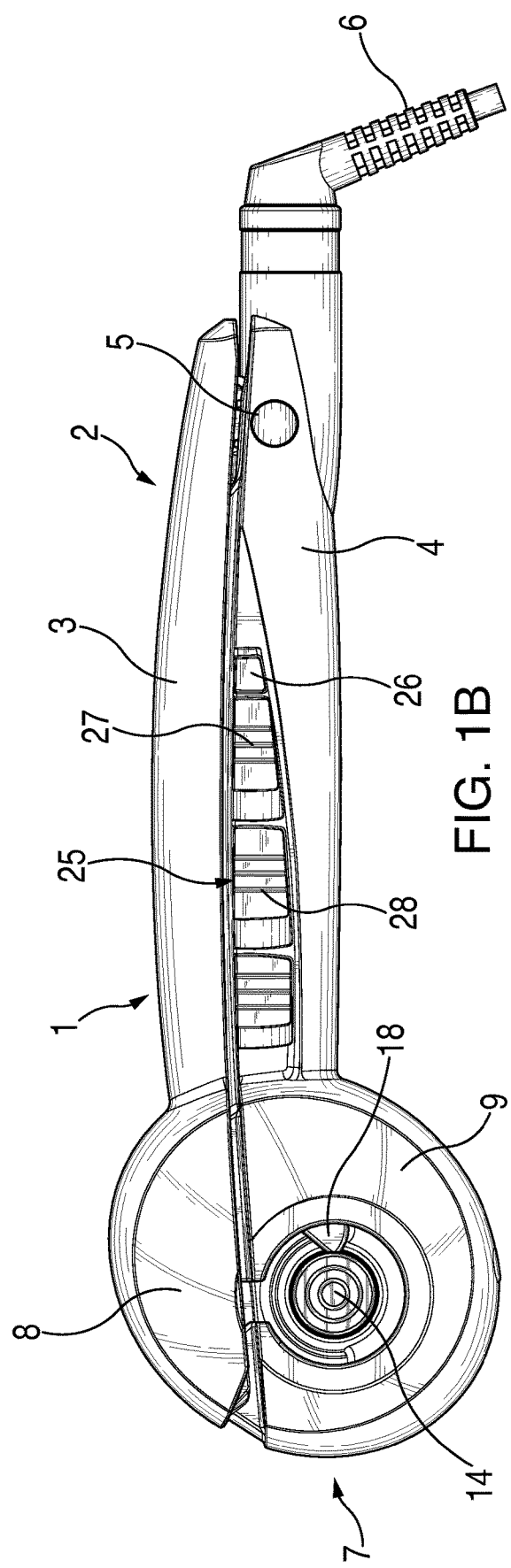

Referring initially to FIGS. 1A-1E, in conjunction with FIGS. 2-3, the hair styling apparatus 1 in accordance with the principles of the present disclosure is illustrated. The hair styling apparatus 1 is particularly adapted to apply a curling effect or treatment on the hair of a subject and incorporates an ion generator to deliver positive and/or negative ions to hair to enhance the appearance of hair, condition and hydrate hair, and facilitate its drying.

The apparatus 1 includes a handle section 2 including an upper handle 3 and a lower handle 4 connected to each other at their proximal ends by a hinge section 5 in a pivotal relationship. The upper and lower handles 3, 4 are spring biased to an open position depicted in FIGS. 2-3 and are adapted to be pivoted toward each other into a closed position as shown in FIGS. 1A-1E. A connector 6 may be pivotally coupled to the lower handle 4 through fastener(s) "f". The upper end of the connector 6 may slide within a groove (not shown) in upper handle 3 upon movement to the closed position. A torsion spring or similar mechanism (not shown) may bias the connector 6 to the general vertical position depicted in FIG. 3 corresponding to the open position of the upper and lower handles 3,4. An electrical power cord "e" has a conventional plug (not shown) at one end to engage a power source such as a wall outlet to provide electrical energy to operate the appliance. In the alternative, or optionally, the apparatus 1 may be battery operated. The battery may be rechargeable.

Figure 4:
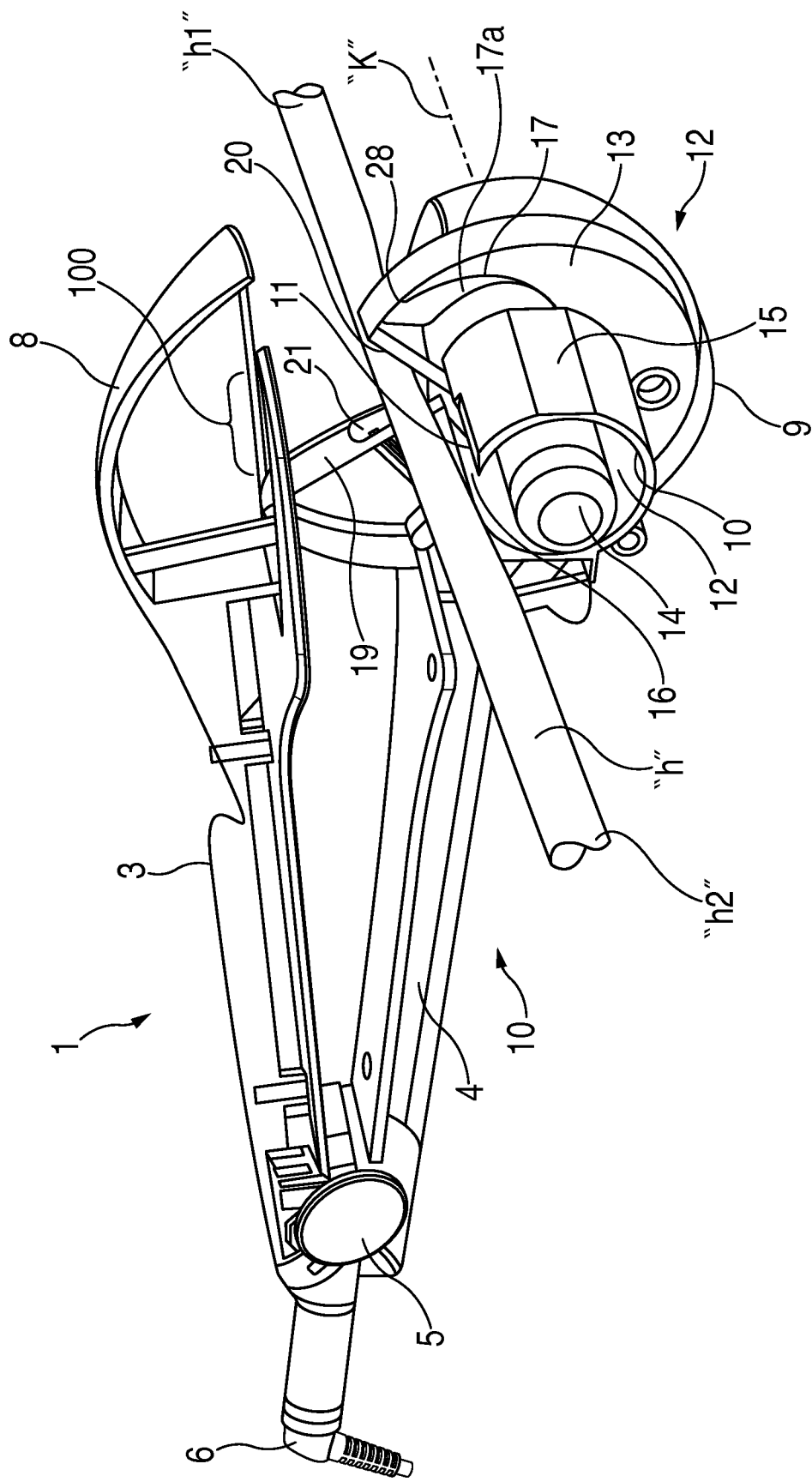
FIG. 4 is a perspective view of the hair styling apparatus in partial cross-section illustrating the rotatable hair engaging component.

With particular reference to FIGS. 2-4, the apparatus 1 includes a head section 7 located at the distal end of the handle section 2. The head section 7 includes an upper head or body 8 attached to the upper handle 3 and a lower head or body 9 attached to the lower handle 4. The lower head 9 includes a round, side opening 10 and a slot-shaped or primary top opening 11 to receive a swatch of hair "h" positionable within an interior chamber 12 defined by the lower head 9. The side opening 10 permits the swatch of hair to protrude and move out of the interior chamber 12 of the lower head 9 during, or subsequent to, operation.

Figure 5:
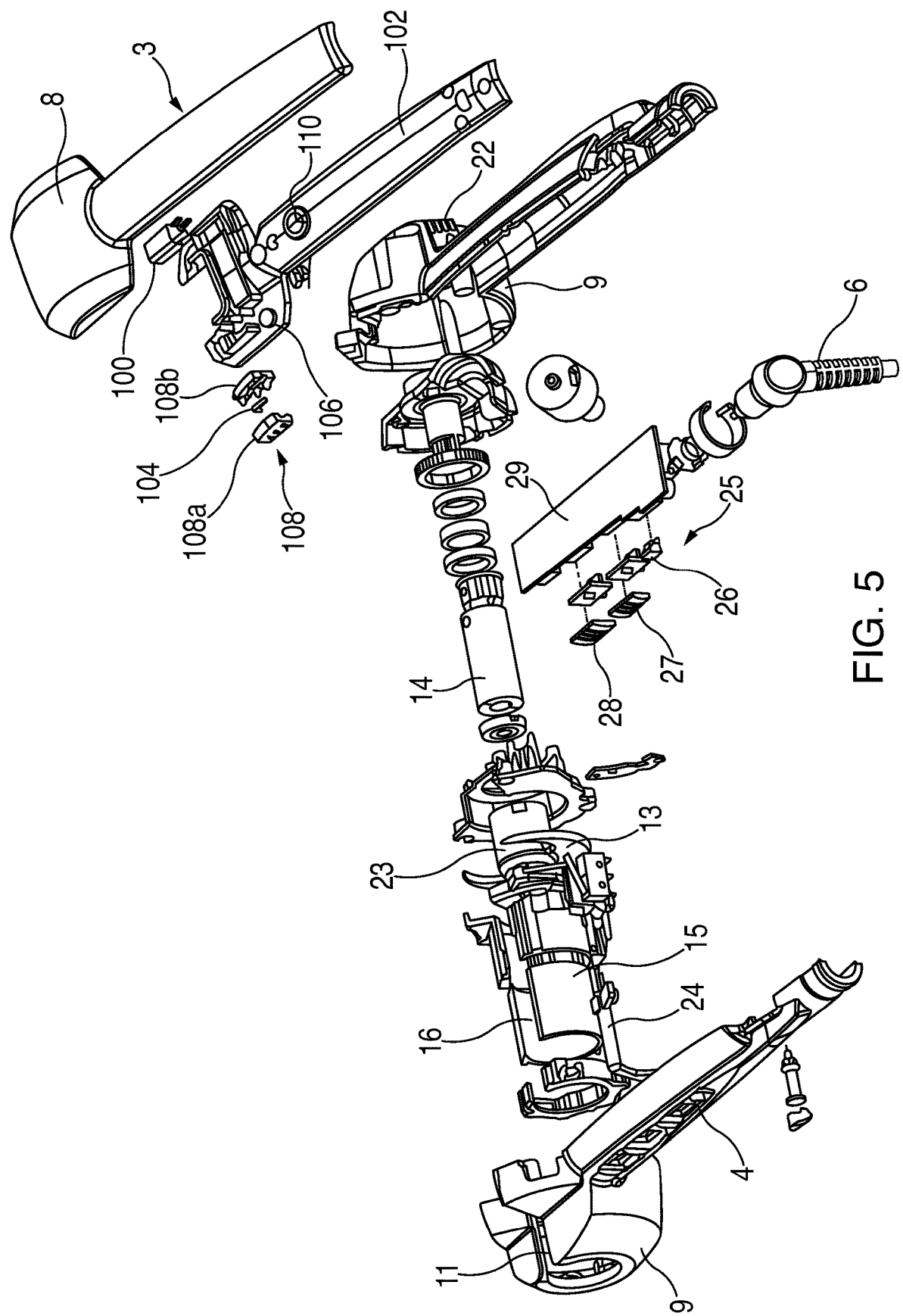
FIG. 5 is an exploded perspective view of the hair styling apparatus.
Figure 6:
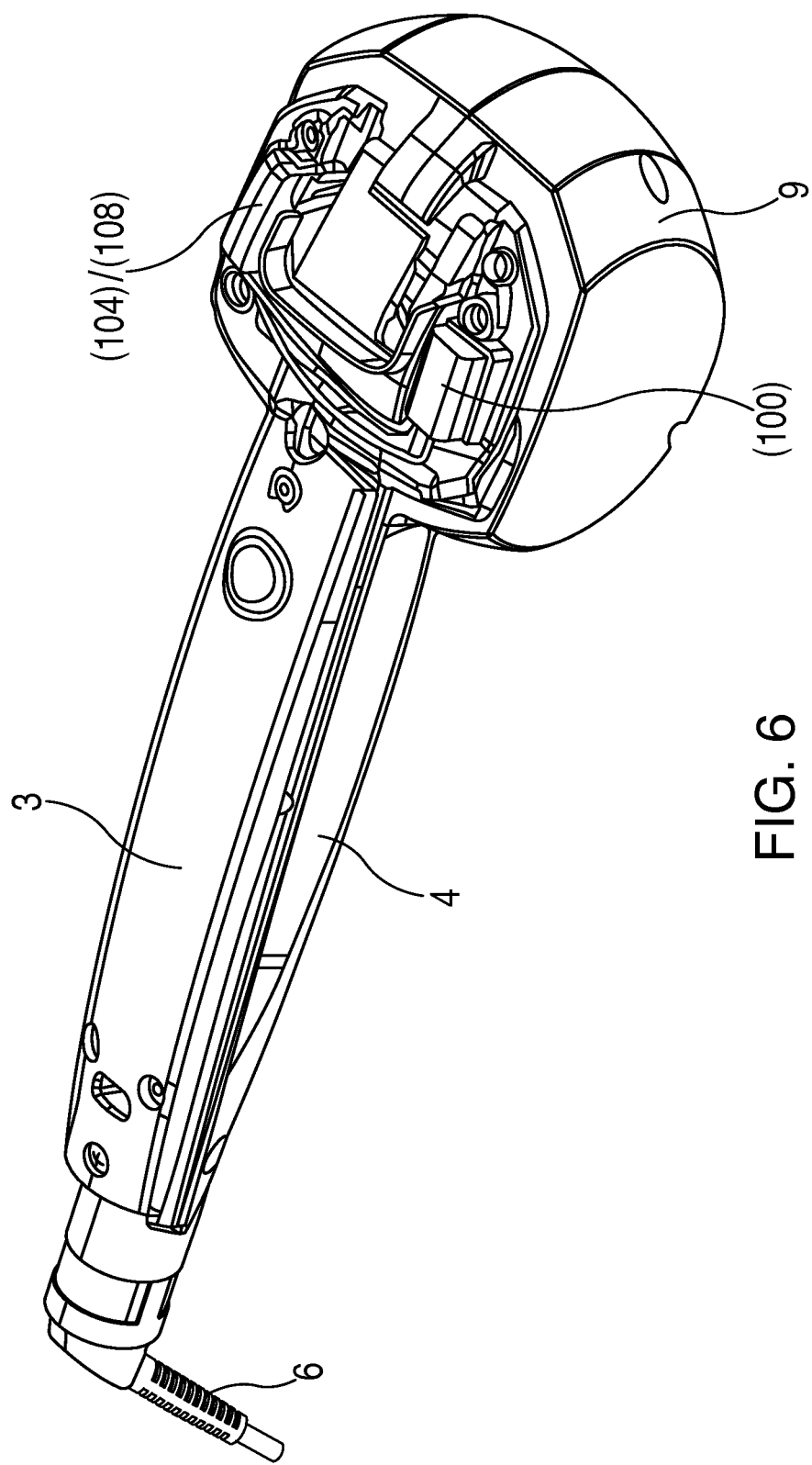
FIG. 6 is a perspective view of the hair styling apparatus with portions removed illustrating the ion generator.

As best depicted in FIGS. 4-5, a rotatably-mounted, hair-engaging component 13 (e.g., rotatable component) is mounted within the lower head 9 and is adapted to selectively rotate, thereby causing the swatch of hair "h" positioned in the interior chamber 12 of the lower head 9 to be wound about a stationary, internal post or elongate member 14 that is also located inside of the interior of the lower head 9. In one embodiment, a cylinder 15 is mounted within the lower head 9 and coaxially arranged about the internal post 14 to define the chamber 12. The cylinder 15 may define a slot 16 positioned in alignment with the top opening 11 so that a swatch of hair may be urged through both the slot 16 of the cylinder 15 and the top opening 11 of the lower head 9 by the rotatable component 14.

The rotatable component 13 has a leading edge or hair engaging surface 17 which engages and captures the hair "h" during its rotation about axis "k" (FIG. 4). The leading edge 17 may be arcuate, and is adapted to pull the hair "h" through the top opening 11 and the slot 16 of the cylinder 15 and wrap the hair "h" about the internal post 14 as described in the aforementioned U.S. Pat. Nos. 8,607,804, 8,651,118, 8,733,374 and 8,869,808. At least a portion or all of the leading edge 17 is radially spaced from the internal post 14 thereby defining at least a partial annular space 17*a* therebetween. The rotatable component 13 projects beyond the primary top opening 11. A hair retainer or abutment 18 (FIG. 1B) may be positioned within the lower head 9. The retainer 18 engages and/or retains a segment of the hair "h" during rotation of the rotatable component 13 such that the hair "h" is wound about the internal post 14. In one embodiment, the retainer 18 is dimensioned such that the hair as it is being curled is disposed or retained between the rotatable component 13 and the retainer 18. The retainer 18 may be movable to permit removal of the wound hair subsequent to treatment. In one embodiment, the retainer 18 may be movable from the closed extended position depicted in FIG. 1B to the open position depicted in FIG. 3. The retainer 18 may be spring-biased to its "open" position, and is driven to its "closed" position as the upper and lower handles 3, 4 are moved to the closed position. Any means for effecting this movement of the retainer 18 may be appreciated by one skilled in the art including linkages, springs or the like. Accordingly, as the upper and lower handles 3, 4 are separated at the end of a styling operation, the retainer 18 automatically moves from the closed extended position shown in FIG. 1B to its open position depicted in FIG. 3. It is arranged that the retainer 18, in its open position, allows the styled length of hair to pass out of the side opening 10, i.e. to slide along the internal post 14 towards and subsequently off its free end. Little force is required to separate the hair styling apparatus 1 from the length of hair "h" which has been styled, and because the side opening 10 is annular and surrounds the internal post 14, the length of hair "h" is not required to pass any obstruction or otherwise be forced to uncurl during its removal from the hair styling apparatus 1, so that the curvature of the curls created can be substantially maintained. In the closed position, the retainer 18 may engage the adjacent segment of the hair and retain this segment during the curling process.

In particular, as the rotatable component 13 rotates (counter-clockwise as drawn in FIG. 4), its leading edge 17 passes over the length of hair "h" which lies adjacent to the top opening 11, and engages and captures the length of hair "h". The rotatable component 13 pulls the length of hair "h" through the top opening 11 and into the chamber 12. Considering the length of hair "h", the end "h1" is the free end of the length of hair, and the end "h2" is connected to the user's head (not shown). The hair styling apparatus 1 is intended to impart curls to substantially all of the length of hair "h". As the rotatable component 13 rotates, the distal portion of the length of hair "h" (which lies between the rotatable component 13 and the free end "h1") is pulled through the top opening 11 to the far side of the rotatable component 13 in FIG. 4. The introduction of the swatch of hair "h" into the apparatus 1 is facilitated by a pair of inclined surfaces 19 and 20, which lie to opposed sides of the top opening 11. The inclined surfaces 19, 20 have cut-outs 21 formed therein to accommodate the rotatable component 13 during its rotation. As best depicted in FIGS. 2 and 5, the lower head 9 has an at least partially closed end 22 which provides a relatively fixed surface. The relative rotation between the rotatable component 13 and the retainer 18 causes the hair to be drawn into the apparatus 1 from the far side or closed end 22 toward the retainer 18 and side opening 10. For example, the retainer 18 may engage the segment of the hair most adjacent to the retainer 18 and retain this hair segment in a relatively fixed position. Thus, during rotation of the rotatable component 13, the hair between the retainer 18 and extending to the free end "h1" will wrap about the internal post 14. In the alternative, or additionally, the retainer 18 may be dimensioned to be engaged by the curled hair during rotation of the rotatable component 13 to essentially block and retain the hair in a fixed position and also prevent the curled hair from exiting the side opening 10. Thus, the retainer 18 may function as an abutment and/or retainer to generally secure a segment of the hair in a generally fixed position relative to the rotatable component 13 to facilitate the curling process.

In this embodiment, the top opening 11 is connected to side opening 10. When the rotatable component 13 is rotated, the proximal portion of the length of hair (which lies between the rotatable component 13 and the hair end "h2"), will also be pulled through the top opening 11 and into the chamber 12, to the near side of the rotatable component 13 as viewed in FIG. 4 to lie adjacent to the internal post 14. Continued rotation of the rotatable component 13 drives the proximal portion of the length of hair "h" to rotate around the internal post 14 until it engages the retainer 18 (FIG. 1B) in the closed extended position.

With reference to FIG. 5, the rotatable component 13 may be mounted for rotational movement within the lower head 9 via conventional means inclusive of, e.g., with various gaskets, bearings, and gears appreciated by one skilled in the art and driven by motor 23. The motor 23 is operatively coupled to the rotatable component 13 through conventional means, and, may provide selective continuous, incremental, and/or reverse movement to the rotatable component 13. In embodiments, one of or both of the cylinder 15 and the internal post 14 can be heated by one or more electrical heat-generating components (e.g. heater 24) to impart heat to the swatch of hair "h" being styled in order to facilitate curling or styling of the hair.

With reference now to FIGS. 2-3 and 5, the apparatus 1 may have one or more control buttons, switches and/or timer lights or displays, generally referred to herein as control button and panel display 25. The panel display 25 may include a power indicator "on" light 26, a temperature switch 27, and time control switch 28. A motor control switch may also be provided. The apparatus 1 may be provided with a switch or contact that is engaged by the action of closing the upper head 8 against the lower head 9, to activate the rotatable component 13 or ion generator as discussed hereinbelow.

The apparatus 1 may include a control circuit e.g., in the form of a circuit board, processor or other logic 29 (FIG. 5), in electrical communication with the panel display 25, that allows selective, or automatic, modes of operation that include a timer and time-out indicator e.g., audio or visual that is activated after operation for a predetermined time interval. Similarly, the control circuit may enable automatic shutoff after a predetermined amount of time or a predetermined number of rotation cycles of the rotatable component 13. The control circuit may provide a means to selectively or automatically control the direction of rotation, the speed, or both, of the rotatable component 13. The control circuit may enable a sensor that senses changes in rotational speed or torque and, in response to predetermined thresholds related thereto, shuts down, slows, and/or reverses direction or rotation of the rotatable component 13. Such a feedback may be used, for example, to prevent tangling or damaging of hair. The apparatus 1 may be provided with a control means that allows a user to selectively activate or de-activate the heating so that it may or may not be used during operation of the apparatus 1.

With reference to FIGS. 5-8, the apparatus 1 includes an ion generator 100 (one or more) mounted to the upper handle 3. In one embodiment, the upper handle 3 includes a frame 102 which supports the ion generator(s) 100. The frame 102 is secured to the upper handle 3 by conventional means. The frame 102 may be removable or releasable relative to the upper handle 3. The ion generator 100 is in communication with one or more ion emitters 104. The ion emitters 104 may be ion pin emitters mounted to the frame 102 and directed toward ion outlet 106. The ion outlet 106 and ion emitter 104 selectively focuses ions (e.g., a concentration of ions) on the hair received within the cylinder 15 and/or the slot 16 and/or positioned about the internal post 14 during the curling process. In embodiments, the ion emitter 104 and ion outlet 106 are disposed adjacent the entry area of the interior chamber 12 of the lower head 9 (FIG. 2) and directed to distribute ions to the hair as it passes within the interior chamber 12 thereby ensuring that the hair to be curled is subjected to the ion distribution. The ion emitter 104 may be mounted within a casing 108. The casing 108 may be removable from the frame 102 for cleaning or replacement of the ion emitter 104, e.g., removal of dust, air particles or other contaminants. The casing 108 may include two casing half sections 108a, 108b coupled together and defining a mount for securing the ion emitter 104.

The one or more ion emitters 104 can have any configuration sufficient to emit ions having selectively different polarities (e.g., negative or positive) and intensities, as well as to conform to the configuration and operation of the apparatus 1. For example, one or more ion emitters 104 can be in the form of a conductive needle, an array of such needles, a conductive plate, or any other like structure. Also, one or more ion emitters 104 can be formed from any material sufficient to effectively emit ions and conform to the configuration and operation of apparatus 1, such as for example, a conductive metal, a conductive polymer, or a carbon material. Further, the one or more ion emitters 104 can be made of a conductive semi-fluid, such as a silicon gel. Still further, one or more ion emitters 104 preferably creates a concentration of ions having either a negative polarity or a positive polarity, or some combination thereof. The ion generator 100 may be any suitable device capable of adjustably generating voltage outputs of varying intensities and of varying polarity combinations. One or more ion emitters 104 can also preferably be arranged to create a predictable area of concentrated ions sufficient to encompass the area adjacent the internal post 14 and to intensify the exposure of ions to the hair.

The apparatus 1 may be provided with a control means that allows a user to selectively activate or de-activate the ion generator 100 so that it may or may not be used during operation of the apparatus 1. The control means may be incorporated with and/or in communication with the circuit board 29. Intermittent use is also contemplated. This may be achieved, for example, by an actuator or button and appropriate logic or circuitry associated with the circuit board 29. In one embodiment, the apparatus 1 incorporates a contact switch 110 (FIGS. 2 and 5) which activates either or both the rotatable component 13 and the ion generator 100 upon closing of the upper and lower handles 3, 4. The contact switch 110 may be in electrical communication with the circuit board 29.

During use, the ion generator may be activated in accordance with any of the aforementioned modes of use to direct a concentration of ions on the hair "h" during, subsequent to, or after the curling process as effected by the rotatable component 13 and associated structure. The ion concentration will enhance the styling effect to the hair while hydrating and conditioning the hair follicles thereby providing a smooth and sleek curled appearance. The ion concentration will also facilitate drying of the hair thereby minimizing heat-related damage.

Persons skilled in the art will understand that the devices and methods specifically described herein and illustrated in the accompanying drawings are non-limiting exemplary embodiments. It is envisioned that the elements and features illustrated or described in connection with one exemplary embodiment may be combined with the elements and features of another without departing from the scope of the present disclosure. As well, one skilled in the art will appreciate further features and advantages of the disclosure based on the above-described embodiments. Accordingly, the disclosure is not to be limited by what has been particularly shown and described.

What is claimed is:

1. A hair styling apparatus, which comprises:
a handle including:
- a first handle member having a first body defining an internal chamber dimensioned to receive a length of hair, the first body defining an entry area leading into the internal chamber through which the length of hair enters and exits the internal chamber; and
- a second handle member including a second body, the second handle member configured for movement relative to the first handle member between an open position and a closed position;
a rotatable component mounted to the first body, the rotatable component configured for rotatable movement to engage the length of hair within the internal chamber to impart a curling effect to the length of hair;
an elongate member mounted at partially within the internal chamber of the first body and defining an axis, the rotatable component configured and adapted for rotational movement about the axis of the elongate member to wrap or curl the length of hair about the elongate member;
an ion generator mounted to the second body of the second handle member; and
an ion outlet within the second body and positioned adjacent and in direct opposition to the entry area leading into the internal chamber of the first body when the first and second handle members are in the closed position and aligned with the elongate member, the ion outlet configured to direct a concentration of ions generated by the ion generator to the length of hair passing within and exiting the internal chamber of the first body; wherein the ion generator includes at least one ion emitter, the at least one ion emitter dimensioned to distribute the concentration of ions through the at least one ion outlet of the second body toward the length of hair; and
wherein the second handle member includes a frame mounted to the second body, the frame having the ion generator and the ion emitter mounted thereto, and defining the at least one ion outlet.

2. The hair styling apparatus according to claim 1 wherein the rotatable component includes a hair engaging surface, the hair engaging surface radially spaced from the elongate member.

3. The hair styling apparatus according to claim 2 including a retainer disposed adjacent the elongate member, the retainer dimensioned to retain a segment of the length of hair relative to the elongate member during rotation of the rotatable component to facilitate formation of curls within the length of hair.

4. The hair styling apparatus according to claim 1 wherein the frame is releasably mounted to the second body of the second handle member.

5. The hair styling apparatus according to claim 1 wherein the ion generator is configured to provide a variety of voltage outputs.

6. The hair styling apparatus according to claim 1 wherein the ion generator is adapted to create an ion concentration having a negative polarity.

7. The hair styling apparatus according to claim 1 wherein the ion generator is adapted to create an ion concentration having a positive polarity.

8. The hair styling apparatus according to claim 1 wherein the ion generator is adapted to create an ion concentration both a positive and negative polarity.

9. The hair styling apparatus according to claim 1 including a heater for heating the length of hair within the internal chamber.

10. The hair styling apparatus according to claim 1 wherein the ion emitter is mounted within a casing, the casing being removably mounted relative to the second body of the second handle member.

11. The hair styling apparatus according to claim 10 wherein the second handle member includes a frame mounted to the second body, the frame having the ion generator and the casing mounted thereto, and defining the at least one ion outlet, the casing being removably mounted to the frame.

12. The hair styling apparatus according to claim 10 wherein the second handle member includes a frame mounted to the second body, the frame having the ion generator mounted thereto, the frame being releasably mounted to the second handle member to permit removal of the ion generator from the second handle member.

13. The hair styling apparatus according to claim 12 wherein the ion emitter is mounted within a casing, the casing being removably mounted to the frame.

* * * * *